(12) United States Patent
Wright

(10) Patent No.: US 8,497,744 B1
(45) Date of Patent: Jul. 30, 2013

(54) LATTICE NETWORK FOR POWER AMPLIFIER OUTPUT MATCHING

(75) Inventor: Peter V. Wright, Portland, OR (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 853 days.

(21) Appl. No.: 12/559,372

(22) Filed: Sep. 14, 2009

(51) Int. Cl.
  *H03H 7/38* (2006.01)
  *H03H 7/19* (2006.01)
(52) U.S. Cl.
  USPC .............................. 333/32; 333/169; 333/138
(58) Field of Classification Search
  USPC ............. 333/32, 33, 4, 5, 204, 205, 174, 167, 333/168, 185, 124, 175; 330/302, 206, 196, 330/193
  See application file for complete search history.

(56) References Cited

U.S. PATENT DOCUMENTS

| | | | |
|---|---|---|---|
| 1,604,981 A * | 11/1926 | Elsasser | 343/860 |
| 4,951,009 A | 8/1990 | Collins | |
| 6,353,360 B1 | 3/2002 | Hau et al. | |
| 7,030,717 B2 * | 4/2006 | Chung | 333/170 |
| 7,071,792 B2 * | 7/2006 | Meck | 333/32 |
| 7,598,827 B2 | 10/2009 | Stuebing et al. | |

* cited by examiner

*Primary Examiner* — Benny Lee
*Assistant Examiner* — Gerald Stevens
(74) *Attorney, Agent, or Firm* — Schwabe Williamson & Wyatt

(57) ABSTRACT

Embodiments of circuits, apparatuses, and systems for a lattice matching network are disclosed. Embodiments may include a power amplifier to provide single-ended amplification of a radio frequency signal. A lattice matching network may be coupled with the power amplifier and may transform a source impedance associated with an output of the power amplifier to a load impedance. In some embodiments, the lattice matching network may include first and second arms coupled in parallel between the power amplifier and an output node. The first arm may include a serial high-low network and the second arm may include a serial low-high network. The serial high-low network and the serial low-high network may provide a passband response with respect to the radio frequency signal. The serial high-low network and serial low-high network may include one or more Pi networks. Other embodiments may be described and claimed.

23 Claims, 16 Drawing Sheets

500

$$\omega L_1 = \sqrt{2R_S R'}$$

$$\omega C_1 = \frac{1}{\sqrt{2R_S R'}}$$

$$\omega L_2 = \sqrt{2R' R_L}$$

$$\omega C_2 = \frac{1}{\sqrt{2R' R_L}}$$

$$\omega L_3 = \frac{\sqrt{2R_S R'}}{1 - \sqrt{R_S / R_L}}$$

$$\omega C_3 = \frac{\sqrt{R_L / R_S} - 1}{\sqrt{2R' R_L}}$$

Figure 5

LATTICE NETWORK FOR POWER AMPLIFIER OUTPUT MATCHING

FIELD

Embodiments of the present disclosure relate generally to the field of circuits, and more particularly to a lattice network for power amplifier output matching.

BACKGROUND

A cellular power amplifier may have a relatively low output impedance of, e.g., 3 Ohms. Typically, this output impedance is transformed to an antenna impedance of, e.g., 50 Ohms, with a lumped-element inductor-capacitor (L-C) low-pass matching network. These matching networks are typically large and can be associated with significant insertion losses. Furthermore, they may work satisfactorily only over a limited bandwidth.

Increasingly, cellular phones operate in multiple modes and across a wider range of frequencies. Also, efficiency improvements and size reductions are constantly being sought for radio frequency functions within the cellular phones, so that additional customer services may be added without compromising usability.

BRIEF DESCRIPTION OF THE DRAWINGS

Embodiments are illustrated by way of example and not by way of limitation in the figures of the accompanying drawings, in which like references indicate similar elements and in which:

FIG. 5 provides closed-form solutions for various components of the lattice network in accordance with some embodiments.

DETAILED DESCRIPTION

Various aspects of the illustrative embodiments will be described using terms commonly employed by those skilled in the art to convey the substance of their work to others skilled in the art. However, it will be apparent to those skilled in the art that alternate embodiments may be practiced with only some of the described aspects. For purposes of explanation, specific devices and configurations are set forth in order to provide a thorough understanding of the illustrative embodiments. However, it will be apparent to one skilled in the art that alternate embodiments may be practiced without the specific details. In other instances, well-known features are omitted or simplified in order not to obscure the illustrative embodiments.

Further, various operations will be described as multiple discrete operations, in turn, in a manner that is most helpful in understanding the present disclosure; however, the order of description should not be construed as to imply that these operations are necessarily order dependent. In particular, these operations need not be performed in the order of presentation.

The phrase "in one embodiment" is used repeatedly. The phrase generally does not refer to the same embodiment; however, it may. The terms "comprising," "having," and "including" are synonymous, unless the context dictates otherwise.

In providing some clarifying context to language that may be used in connection with various embodiments, the phrases "NB" and "A and/or B" mean (A), (B), or (A and B); and the phrase "A, B, and/or C" means (A), (B), (C), (A and B), (A and C), (B and C) or (A, B and C).

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled to each other.

Figure 1:
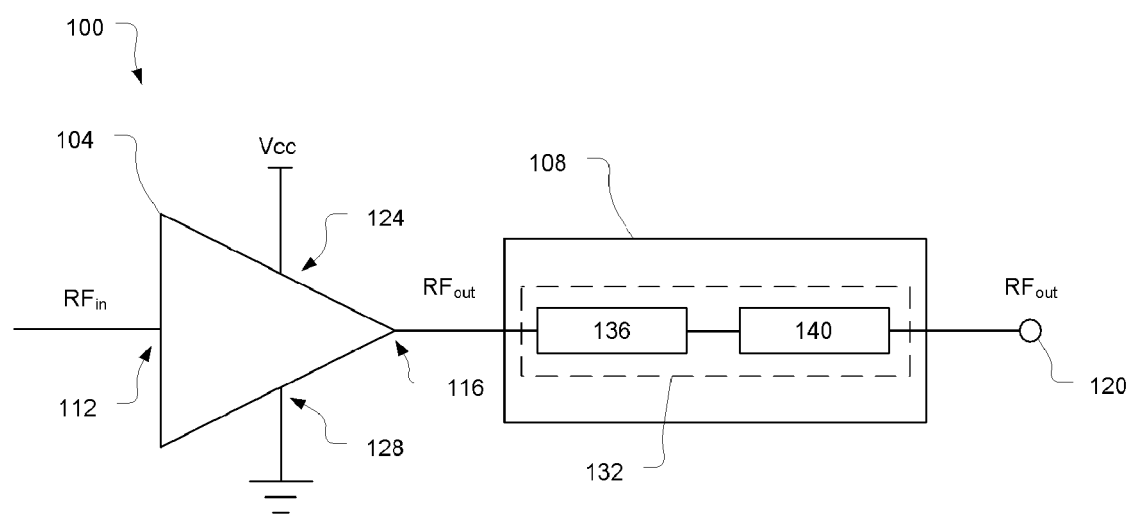
FIG. 1 illustrates amplification circuitry in accordance with various embodiments.

FIG. 1 illustrates amplification circuitry 100 in accordance with some embodiments of the present disclosure. The amplification circuitry 100 generally includes a power amplifier 104 coupled with a matching network 108.

The power amplifier 104 may be configured to receive, at an input radio frequency (RF) terminal 112, an input radio frequency ($RF_{in}$) signal. The power amplifier 104 may amplify the $RF_{in}$ signal to generate an amplified output $RF_{out}$ signal at an output RF terminal 116 and, ultimately, at an antenna port 120.

The power amplifier 104 may be a single-ended amplifier having a positive direct current (DC) power supply terminal 124, coupled with, e.g., Vcc, and a negative DC power supply terminal 128, coupled with, e.g., a ground.

The matching network 108 may transform a source impedance associated with the RF output 116 of the power amplifier 104 to a load impedance associated with an antenna coupled with the antenna port 120. A typical impedance transformation ratio may be 1 to 25.

The matching network 108 may include one or more serial Pi networks, e.g., serial Pi network 132 having Pi network 136 and Pi network 140. Unlike conventional lattice matching networks, which use parallel Pi networks to match an output of a balanced power amplifier to an antenna, the serial Pi network 132 may be used to match an output of a single-ended power amplifier, e.g., power amplifier 104. The serial Pi network 132 may also be configured to provide passband characteristics with low insertion loss, making the matching network 108 well suited to emerging converged amplification embodiments in which the amplification circuitry 100 may be employed.

To provide the passband characteristics, each of the Pi networks may have either low-pass characteristics or high-pass characteristics. For example, if the Pi network 136 has high-pass characteristics, then the Pi network 140 will have low-pass characteristics. This may be referred to as a serial low-high pass Pi network. Conversely, if the Pi network 136 has low-pass characteristics, then the Pi network 140 will have high-pass characteristics. This may be referred to as a serial high-low pass Pi network.

Figure 2A:
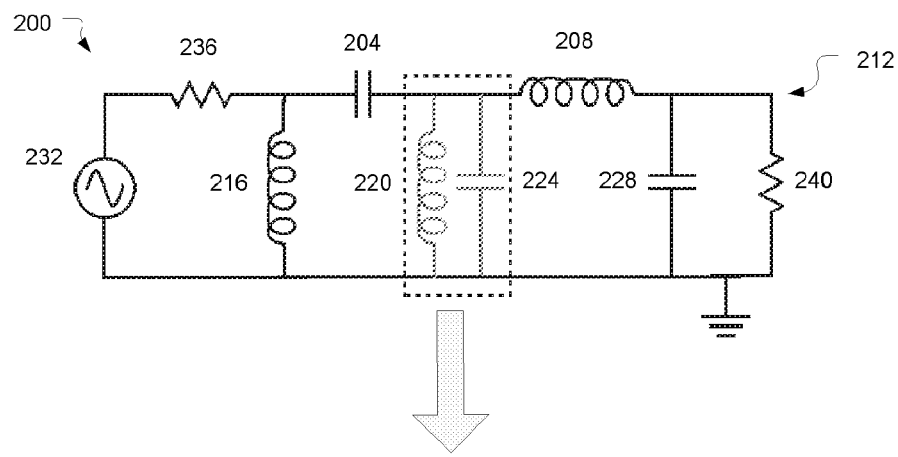
FIGS. 2(a) and 2(b) illustrate two variations of a serial high-low pass Pi network in accordance with some embodiments.
Figure 2B:
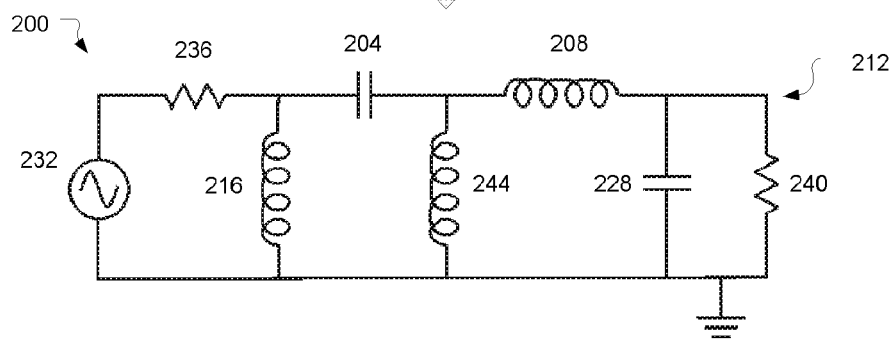

FIGS. 2(a) and 2(b) illustrate two variations of a serial high-low pass Pi network 200 that may be used in the matching network 108 in accordance with some embodiments. The serial high-low pass Pi network 200 (hereinafter "high-low network 200") may include a capacitor 204 coupled in series with an inductor 208 on a rail 212 of the high-low network 200. The high-low network 200 may also include an inductor 216, an inductor 220, a capacitor 224, and a capacitor 228 coupled between the rail 212 and ground.

An alternating current (AC) supply 232 may represent an $RF_{out}$ signal, a resistor 236 may represent a source impedance associated with a power amplifier, e.g., power amplifier 104, and a resistor 240 may represent a load impedance associated with an antenna.

The high-low network 200 may operate to transfer the source impedance to the load impedance in the following manner. A high-pass Pi network section, e.g., the inductor 216, the capacitor 204, and the inductor 220, may be configured to filter out frequencies below a predetermined threshold frequency (hereinafter "low threshold frequency"). The high-pass Pi network section may also provide a phase shift of a first amount, e.g., ninety degrees, in a first direction, e.g., a positive direction. A low-pass Pi network section, e.g., capacitor 224, inductor 208, and capacitor 228, may be configured to filter out frequencies above another predetermined threshold frequency (hereinafter "high threshold frequency"). The low-pass Pi network section may also provide a phase shift of the first amount, e.g., ninety degrees, in a second direction that is opposite the first direction, e.g., a negative direction. Thus, the high-low network 200 may provide a passband response by rejecting signals outside of a desired passband. Furthermore, the phase shifts provided by each of the Pi networks may cancel each other out, resulting in an in-phase output signal.

For embodiments in which the source impedance is less than the load impedance, the inductor 220 and the capacitor 224 may provide a net inductance. Accordingly, in these embodiments, these two components may be replaced by a single inductor 244 as shown in FIG. 2(b).

Figure 3A:
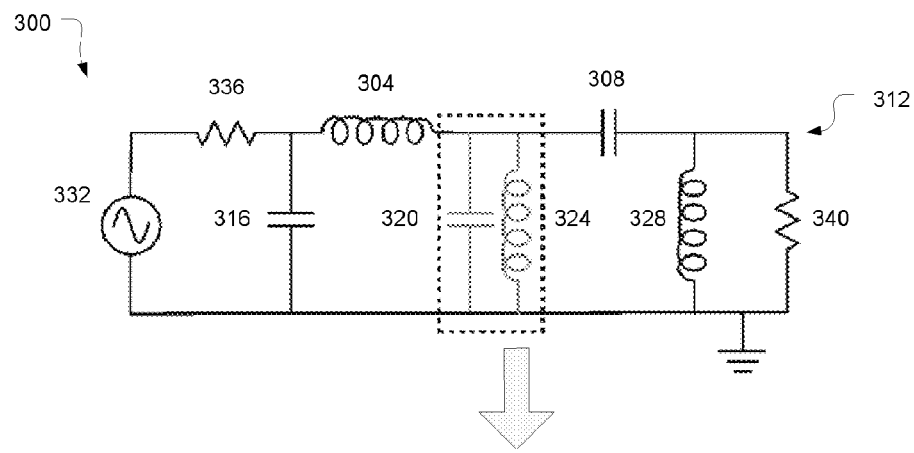
FIGS. 3(a) and 3(b) illustrate two variations of a serial low-high pass Pi network in accordance with some embodiments.
Figure 3B:
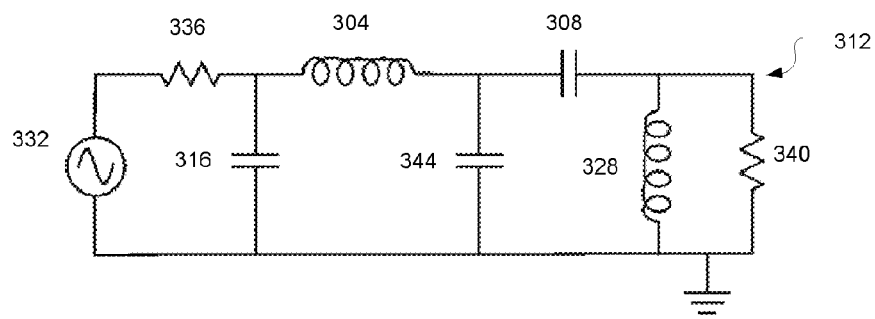

FIGS. 3(a) and 3(b) illustrate two variations of a serial low-high pass Pi network 300 that may be used in the matching network 108 in accordance with some embodiments. The serial low-high pass Pi network 300 (hereinafter "low-high network 300") may include an inductor 304 coupled in series with a capacitor 308 on a rail 312 of the low-high network 300. The low-high network 300 may also include a capacitor 316, a capacitor 320, an inductor 324, and an inductor 328 coupled between the rail 312 and ground.

An alternating current (AC) supply 332 may represent an $RF_{out}$ signal, a resistor 336 may represent a source impedance associated with a power amplifier, e.g., power amplifier 104, and a resistor 340 may represent a load impedance associated with an antenna.

The low-high network 300 may operate to transfer the source impedance to the load impedance in manner similar to the manner described above with respect to the high-low network 200. However, in this embodiment, a positioning of a low-pass network section, e.g., capacitor 316, inductor 304, and capacitor 320, and a high-pass network section, e.g., inductor 324, capacitor 308, and inductor 328, may be reversed from the order described above.

For embodiments in which the source impedance is less than the load impedance, the capacitor 320 and the inductor 324 may provide a net capacitance. Accordingly, in these embodiments these two components may be replaced by a single capacitor 344 as shown in FIG. 3(b).

In some embodiments, the matching network may include either the serial high-low network 200 or the serial low-high network 300. While these embodiments may provide certain advantages over conventional matching networks, in other embodiments, the matching network 108 may include a first arm having the serial high-low network 200 and a second arm, coupled in parallel with the first arm, having the serial low-high network 300. Such an embodiment may be referred to as a single-ended lattice network (hereinafter "lattice network").

Figure 4A:
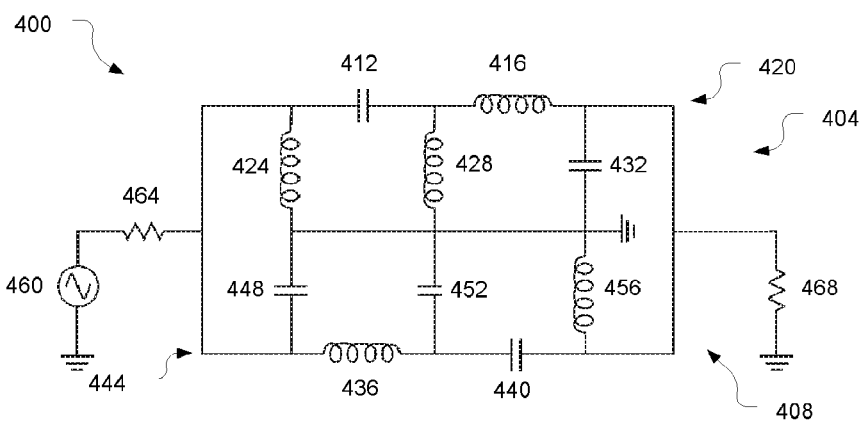
FIGS. 4(a) and 4(b) illustrate two variations of a lattice network in accordance with some embodiments.
Figure 4B:
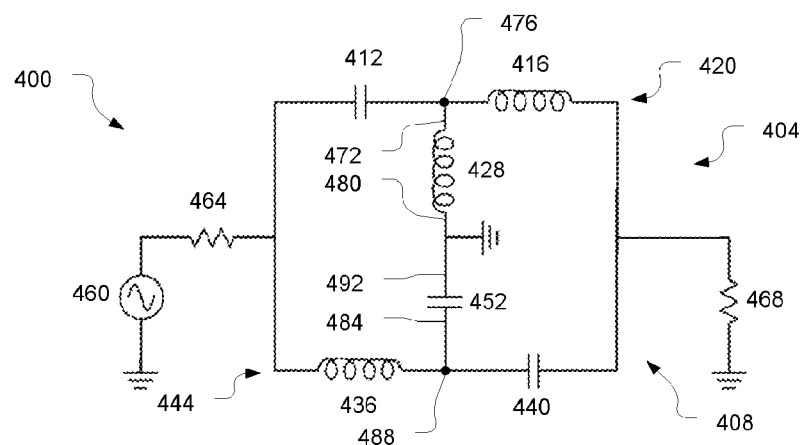

FIGS. 4(a) and 4(b) illustrate two variations of a lattice network 400 that may be used in the matching network 108 in accordance with some embodiments. The lattice network 400 may include a first arm 404 coupled in parallel with a second arm 408. The first arm 404 may be a high-low network having a capacitor 412 coupled in series with an inductor 416 on a first rail 420. The first arm 404 may also include an inductor 424, an inductor 428, and a capacitor 432 coupled between the first rail 420 and ground.

The second arm 408 may be a low-high network having an inductor 436 coupled in series with a capacitor 440 on a second rail 444. The second arm 408 may also include a capacitor 448, a capacitor 452, and an inductor 456 coupled between the second rail 444 and ground.

An alternating current (AC) supply 460 may represent an $RF_{out}$ signal, a resistor 464 may represent a source impedance associated with a power amplifier, e.g., power amplifier 104, and a resistor 468 may represent a load impedance associated with an antenna.

Providing the dual arms of the lattice network as shown results in the currents in arms 404 and 408 being half of a current that would be in a single-armed lattice network. This may allow for smaller components to be utilized. Furthermore, the symmetrical arrangement of arms 404 and 408 has the additional advantage that several elements of the arms are self-canceling, thereby reducing the total number of elements.

The symmetrical arrangement may result in an input impedance of arm 404 that is essentially a complex conjugate of an input impedance of arm 408. This may be due to a reactance contribution provided by the inductor 424 being substantially equal to and the opposite of a reactance contribution provided by capacitor 448. Thus, these two elements effectively cancel each other out. Similarly, the output impedance of arm 404 may be essentially a complex conjugate of an output impedance of arm 408, due to equal and opposite reactance contributions from capacitor 432 and inductor 456. Thus, these elements may also cancel each other out. Accordingly, the variation of the lattice network 400 shown in FIG. 4(b) does not include these elements, yet functions in a similar manner as the variation shown in FIG. 4(a).

The complex conjugate relationships of the arms 404 and 408 results in the input and output impedances of the lattice network 400 being composed primarily, if not solely, of a resistance portion, i.e., the real portion, of the respective impedances.

Referring to FIG. 4(b) in more detail, the first arm 404 includes only one component, i.e., inductor 428, coupled between the first rail 420 and ground. The inductor 428 may include a first terminal 472 coupled with a node 476, which is on the first rail 420 between the capacitor 412 and the inductor 416, and a second terminal 480 coupled with ground. The second arm 408 may also only include one component, i.e., capacitor 452, coupled between the second rail 444 and ground. The capacitor 452 may include a first terminal 484 coupled with a node 488, which is on the second rail 444 between the inductor 436 and the capacitor 440, and a second terminal 492 coupled with ground.

The variation of the lattice network 400 in FIG. 4(b) may be realized with a limited number of components, e.g., three inductors and three capacitors, of modest size. These components may be discrete components and, thereby, provide opportunities for rapid prototyping, testing, and optimization. In some embodiments, one or more of the components may be integrated into a semiconductor die composed of, e.g., gallium arsenide (GaAs), silicon, indium phosphide, silicon carbide, or other semiconductor materials or a passive die composed of, e.g., glass, sapphire, or high-resistivity silicon or other passive die materials.

In some embodiments, the matching networks described herein, e.g., the lattice network 400, may provide an impedance transformation ratio of 1 to 25 or greater, over a fractional bandwidth of 15 percent or greater with an insertion loss of 0.8 dB or less. The fractional bandwidth may include a passband of approximately 800 megahertz (MHz) to 950 MHz and/or a passband of approximately 1700 MHz to 2000 MHz.

FIG. 5 provides the closed-form solutions 500 for the various components of the lattice network 400 in accordance with some embodiments. In the solutions 500, $\omega$ is an angular frequency; $L_1$ is an inductance of inductor 436; $R_S$ is a source impedance, modeled by resistor 464; R' is the real part of the transformed source impedance at nodes 476 and 488, a design parameter; $C_1$ is a capacitance of capacitor 412; $L_2$ is an inductance of inductor 416; $R_L$ is a load impedance, modeled by resistor 468; $C_2$ is a capacitance of capacitor 440; $L_3$ is an inductance of inductor 428; and $C_3$ is a capacitance of capacitor 452.

Figure 6:
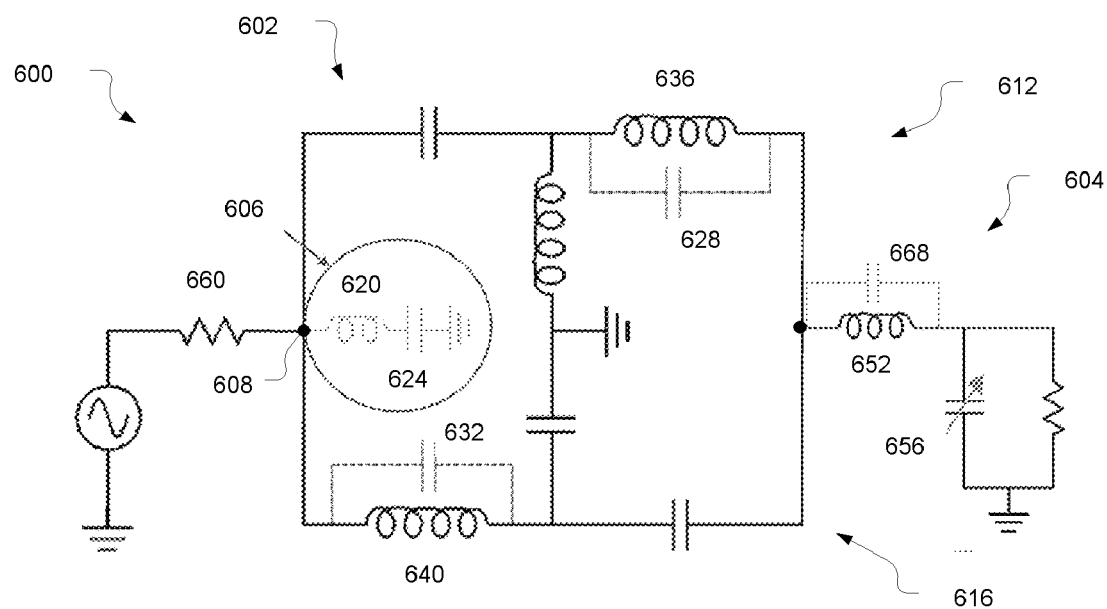
FIG. 6 illustrates a network in accordance with further embodiments.

FIG. 6 illustrates a network 600 that may be used in the amplification circuitry 100 in accordance with some embodiments. The network 600 may include a lattice network 602, which may be similar to the lattice network 400 of FIG. 4(b) with some additional features, and a tunable matching network 604.

One additional feature of the lattice network 602 is related to harmonic termination. It may be desirable to terminate power amplifier (PA) generated harmonics at a PA output node with correct phase to increase efficiency. High harmonic rejection may also be desired to meet regulatory spurious emission requirements. Traditional transformer approaches most likely require filters after the matching network, which tend to increase post PA loss, amplifier size, and cost. Similarly, providing harmonic terminations in conventional L-C matching networks may also be associated with significant insertion losses. The lattice network 602, on the other hand, may be well suited for low-loss harmonic termination.

In some embodiments, harmonic termination is provided by addition of a series harmonic trap 606 coupled with a PA output node 608 that is between arm 612 and arm 616, as shown. The series harmonic trap 606 may include an inductor 620 coupled in series with a capacitor 624. The series harmonic trap 606 may cause a low impedance at node 608 at a designated harmonic, e.g., $2^{nd}$ or $3^{rd}$ harmonic, to terminate the harmonic with only a negligible increase of in-band insertion loss.

In some embodiments, capacitors 628 and 632 may be respectively coupled in parallel with inductors 636 and 640 in the low pass filter of the respective arms 612 and 616, as shown. These capacitors may provide a parallel resonance that resembles a high impedance at a design frequency, e.g., the designated harmonic frequency. Thus, these capacitors may act as a band stop at the harmonic frequency.

Figure 7A:
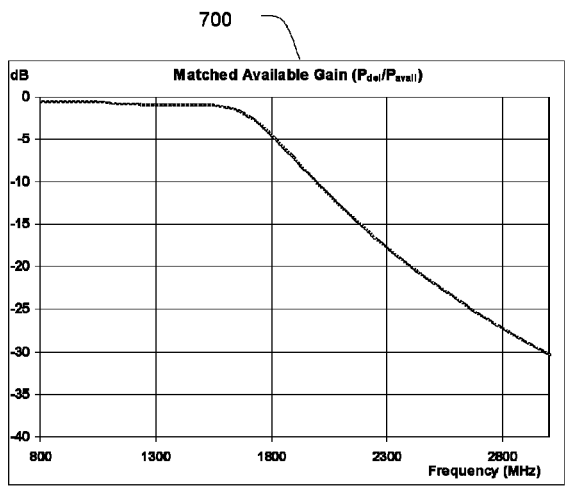
FIGS. 7(a) and 7(b) provide charts showing matched available gain without harmonic traps and with harmonic traps in some embodiments.
Figure 7B:
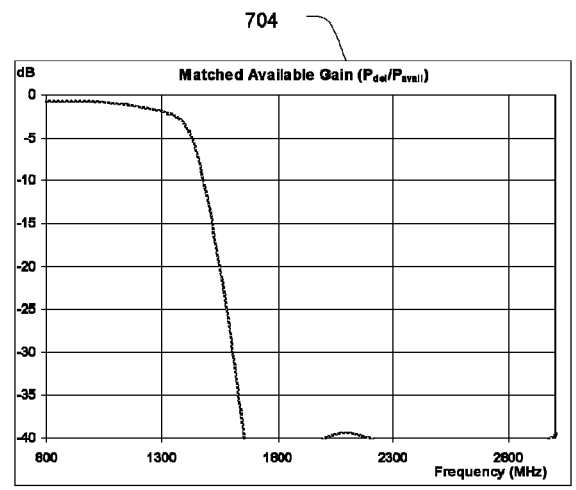

FIGS. 7(a) and 7(b) provide charts 700 and 704 respectively showing matched available gain, in decibels (dB), as a function of frequency without harmonic traps and with harmonic traps in some embodiments. Matched available gain may be equal to a ratio of delivered power, $P_{del}$, to available power, $P_{avail}$. In this embodiment, the passband may be 804-935 MHz and the source impedance may be 2.5 Ohms.

In an embodiment including the harmonic traps, e.g., as is found in lattice network 602, the attenuation at a second harmonic frequency of 1739 MHz may be −68 dB with a phase of 180 degrees; and the attenuation at a third harmonic frequency of 2608.5 may be −65 dB with a phase of 65 degrees. This high harmonic attenuation may occur with relatively little additional in-band loss. For example, the maximum in-band loss of an embodiment that does not include a harmonic trap may be 0.59 dB, while the maximum in-band loss of an embodiment that includes a harmonic trap may be 0.71 dB.

Referring again to FIG. 6, the tunable matching network 604 may include a series inductor 652 coupled with a variable shunt capacitor 656. In operation, it may be desirable to vary the power amplification of the amplification circuitry 100. In some embodiments, this may be done by varying the input impedance of the lattice network 602 at node 608, corresponding to a change of the source impedance (resistor 660) associated with varying output power levels from the amplifier. The input impedance of the lattice network 602 can be varied over a significant range, and maintained close to the real axis, by varying capacitor 656 and by appropriate choice of inductor 652. Thus, in this embodiment, the tunable matching network 604 may be configured to provide a variable impedance transformation, enabling high amplification efficiency to be maintained over a wide range of output powers. This may be advantageous for dynamic load modulation for maintaining efficiency at backed-off powers. In this embodiment, a capacitor 668 may be coupled in parallel with the inductor 652 to provide attenuation of unwanted frequencies above the passband.

Figure 8:
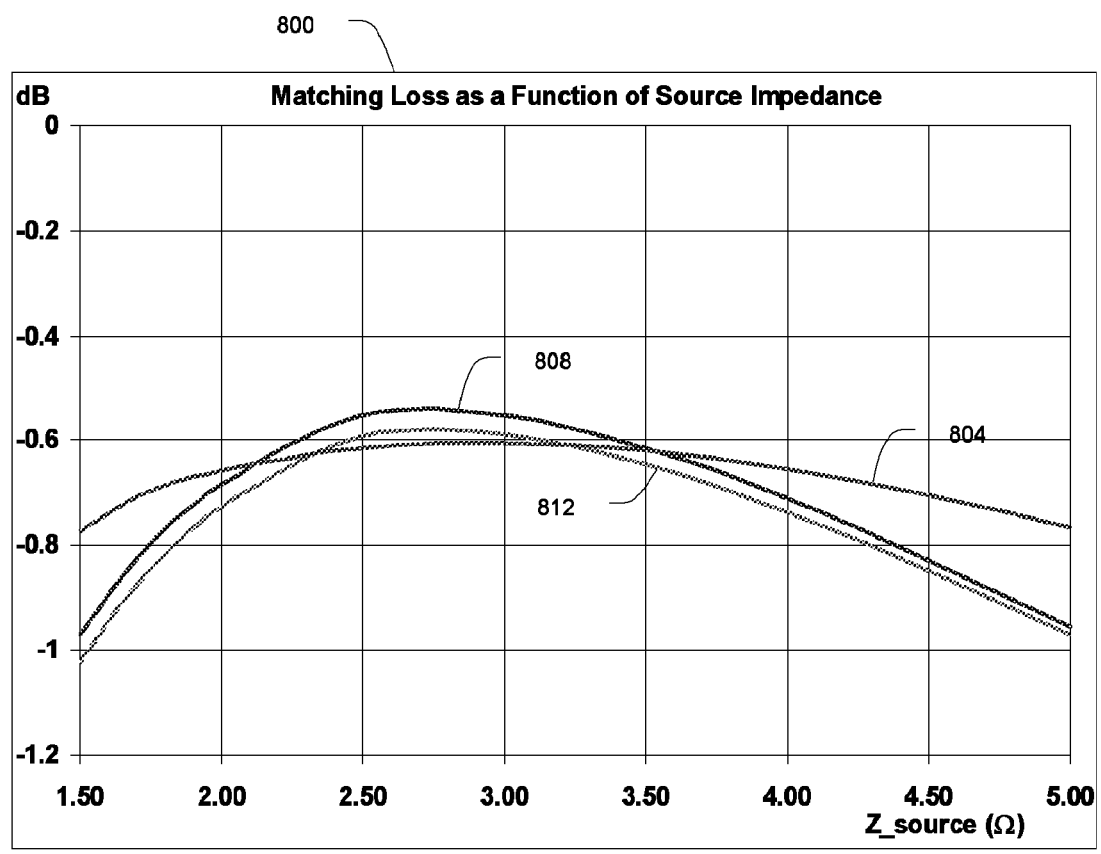
FIG. 8 is a chart comparing matching losses as a function of source impedance in accordance with some embodiments.

FIG. 8 is a chart 800 comparing matching losses as a function of source impedance in accordance with some embodiments. In particular, line 804 may be associated with the network 600, line 808 may be associated with a conventional transformer with a k-factor of 0.9, and line 812 may be associated with a conventional transformer with a k-factor of 0.8. As can be seen, the variation in the matching loss of the network 600 is less across the range of source impedances shown than that provided by either of the transformers.

Varying the source impedance and tuning a lattice matching network may be suitable for a limited range of output powers. However, in some embodiments, a greater range of output powers may be desirable.

Figure 9:
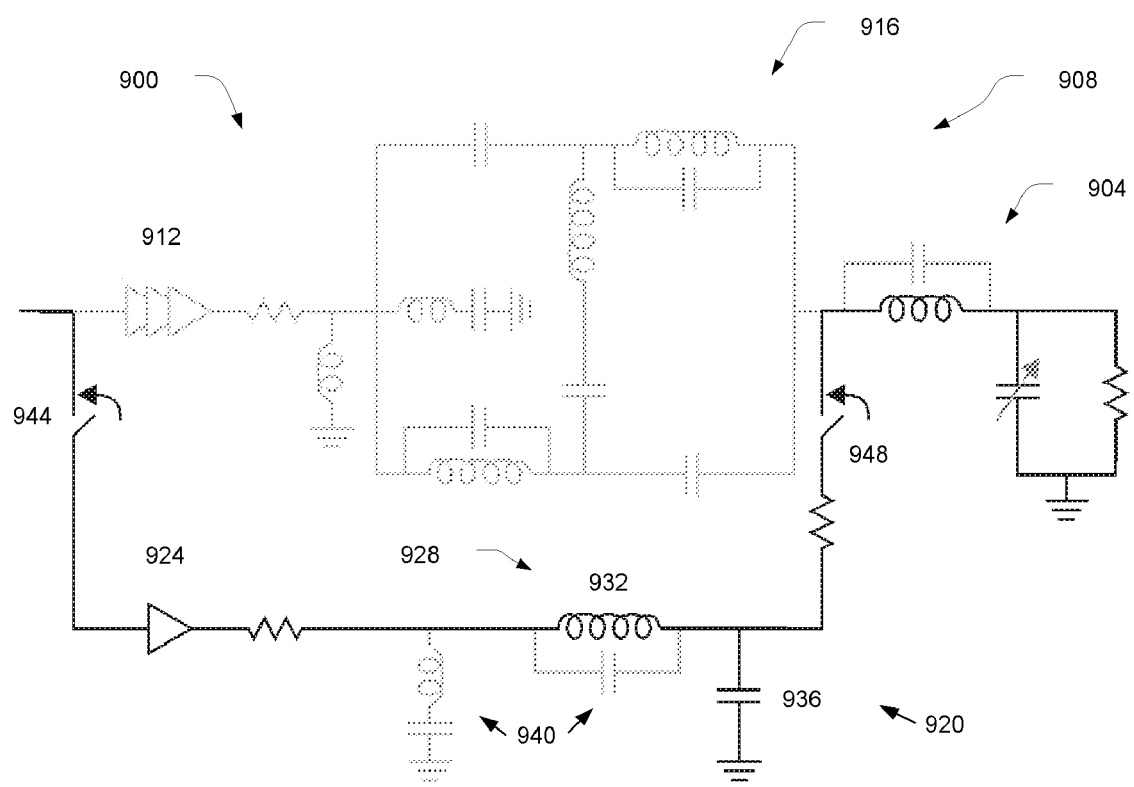
FIG. 9 illustrates amplification circuitry capable of providing an increased range of output powers in accordance with some embodiments.

FIG. 9 illustrates amplification circuitry 900 capable of providing an increased range of output powers in accordance with some embodiments. The components described with respect to amplification circuitry 100 may be substantially interchangeable with like-named components of amplification circuitry 900 and vice versa.

The amplification circuitry 900 may include a high-power path 908 having a high-power PA 912 and a lattice network 916, which resembles lattice network 602. The amplification circuitry 900 may also include a low-power path 920 that includes a low-power PA 924 and an L-C matching network 928 that has a series inductor 932 and a shunt capacitor 936. In some embodiments, the L-C matching network 928 may include harmonic-impeding components 940 that function similar to the harmonic trap 606 and parallel capacitors, e.g., capacitor 628, described above with respect to FIG. 6.

When the amplification circuitry 900 is operating in a high-power mode, switches 944 and 948 in the low-power path 920 may be opened to switch in the high-power path 908, which may operate as described above. When the amplification circuitry 900 is operating in a low-power mode, switches 944 and 948 in the low-power path 920 may be closed to switch in the low-power path 920, thereby bypassing the lattice network 916, so that the impedance transformation is provided by the L-C matching network 928. The impedance on the low-power PA 924 may be adjusted over a wide range with low post PA loss to increase low-power efficiency by using a tunable matching network 904 in a manner similar to that described above with respect to tunable matching network 604.

FIGS. 10-14 provide various charts showing high-power and low-power performance of the amplification circuitry 900 in accordance with various embodiments. For these embodiments, a voltage source may be 3.5 volts, a maximum output power may be 35 dBm, a maximum power added efficiency may be 60%, a high-power source impedance may range from 1.7-6.0 Ohms, and a low-power source impedance may range from 4.0-40.0 Ohms.

Figure 10:
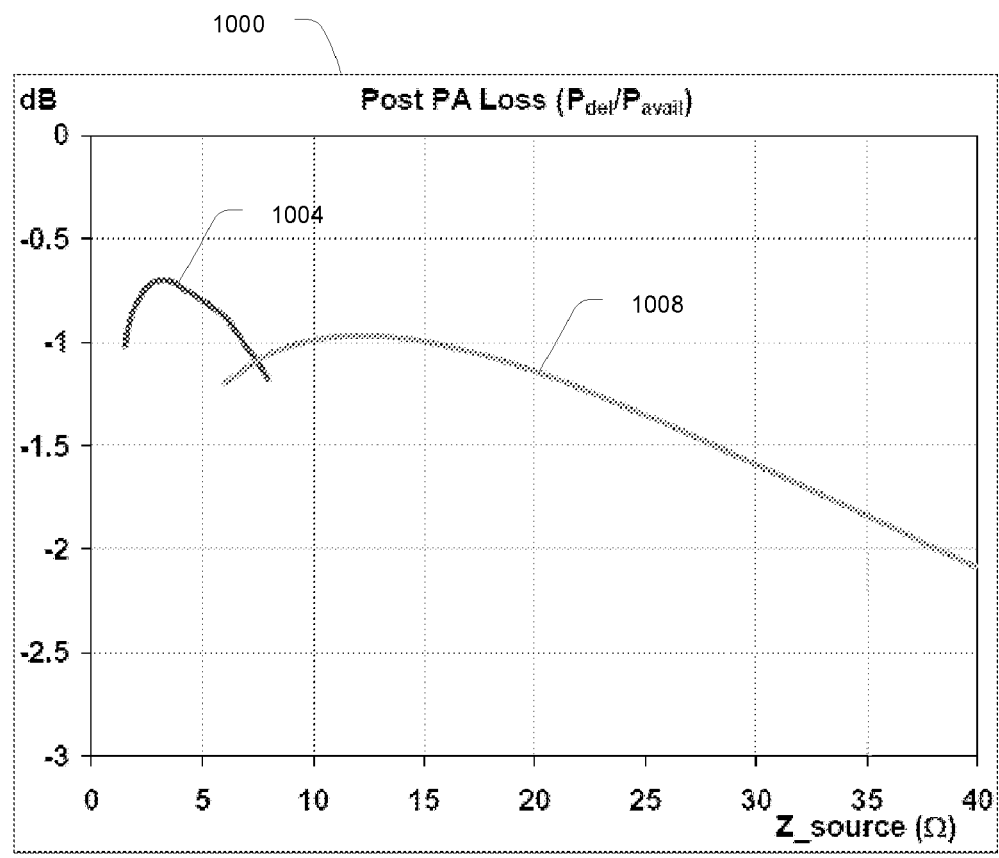
FIGS. 10-14 provide various charts showing high-power and low-power performance of amplification circuitry in accordance with various embodiments.

FIG. 10 is a chart 1000 showing post PA loss, in dB, as a function of source impedance, in Ohms, in accordance with some embodiments. The post PA loss may be equal to a ratio of delivered power, $P_{del}$, to available power, similar to $P_{avail}$, similar to matched available gain. The chart 1000 includes a line 1004 that may be a with the high-power post PA loss and line 1008 that may be associated with low-power post PA loss.

Figure 11:
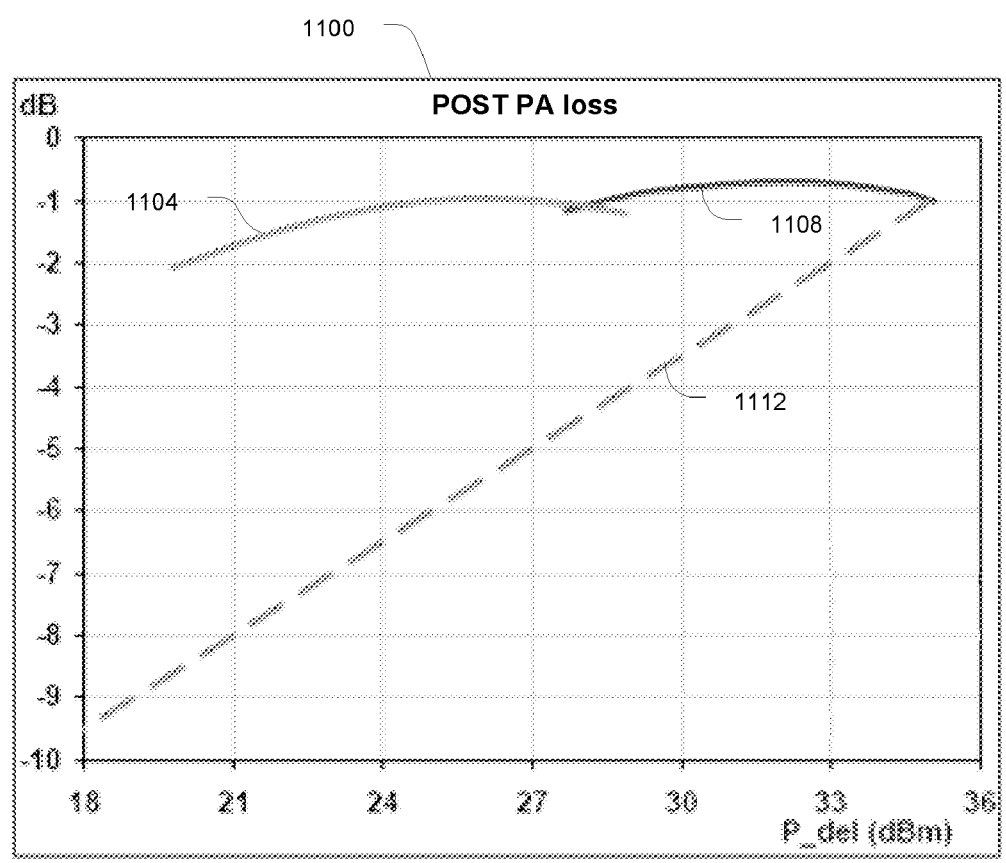

FIG. 11 is a chart 1100 showing post PA loss, in dB, as a function of $P_{del}$, in dBm, in accordance with some embodiments. In particular, line 1104 may be associated with post PA losses of the amplification circuitry 900 while in the low-power mode; line 1108 may be associated with post PA losses of the amplification circuitry 900 while in the high-power mode; and line 1112 may be associated with post PA losses of conventional amplification circuitry using a fixed matching network.

Figure 12:
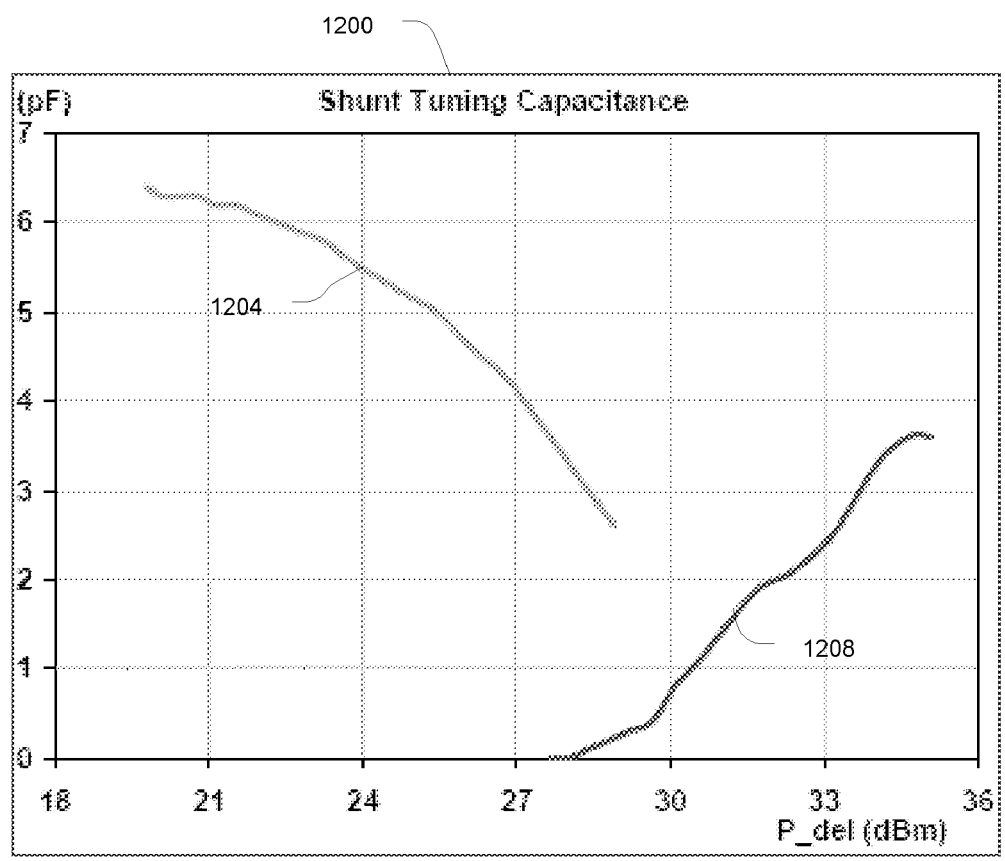

FIG. 12 is a chart 1200 showing shunt tuning capacitance, in pico Farads (pF), of a variable capacitor of the tuning network of the amplification circuitry 900 as a function of $P_{del}$, in dBm, in accordance with some embodiments. In particular, line 1204 may be associated with shunt capacitance of the variable capacitor when the amplification circuitry 900 is in the low-power mode; and line 1208 may be associated with the variable capacitor when the amplification circuitry 900 is in the high-power mode.

Figure 13:
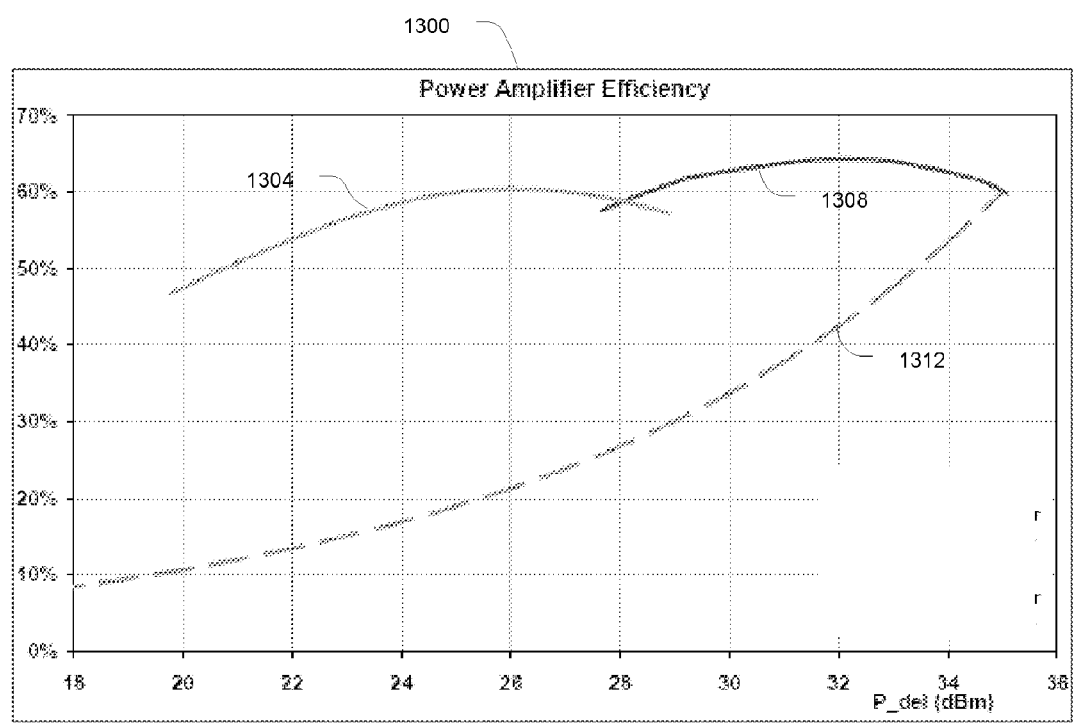

FIG. 13 is a chart 1300 showing PA efficiency as a function of $P_{del}$, in dBm, in accordance with some embodiments. In particular, line 1304 may be associated with a power efficiency of the amplification circuitry 900 when it is in the low-power mode; line 1308 may be associated with a power efficiency of the amplification circuitry 900 when it is in the high-power mode; and line 1312 may be associated with a power efficiency of a conventional amplification circuitry with a fixed matching network.

Figure 14:
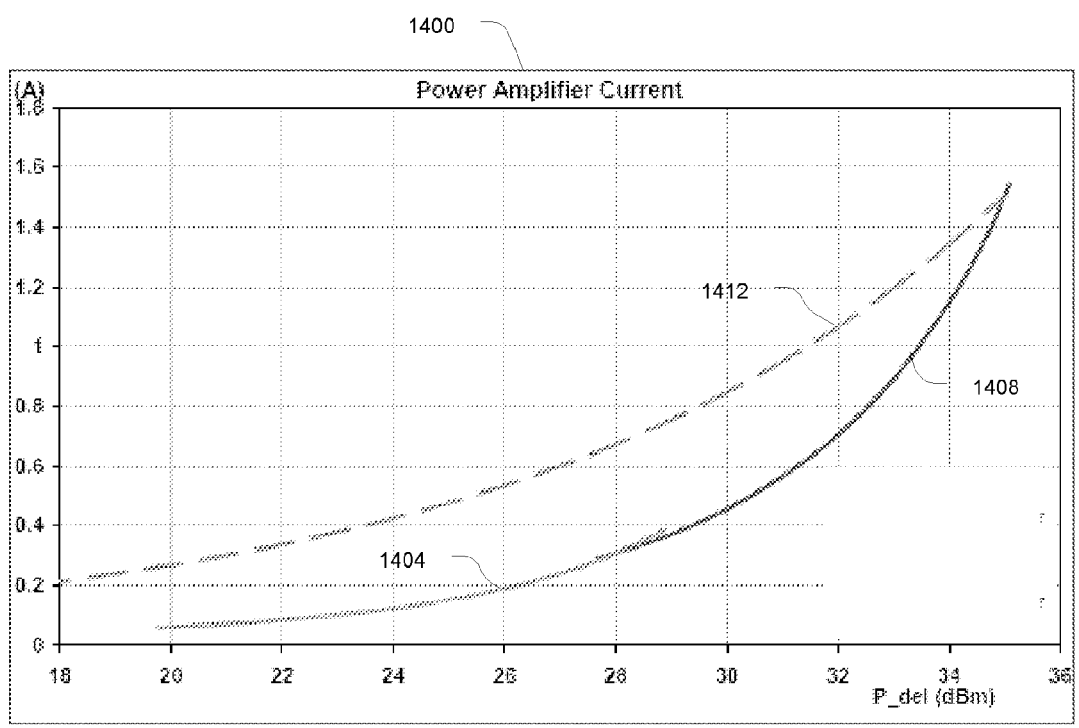

FIG. 14 is a chart 1400 showing PA current, in Amperes (A), as a function of $P_{del}$, in dBm, in accordance with some embodiments. In particular, line 1404 may be associated with a PA current of the low-power PA 924 of the amplification circuitry 900 when it is in the low-power mode; line 1408 may be associated with a current of the high-power PA 912 of the amplification circuitry 900 when it is in the high-power mode; and line 1412 may be associated with a power efficiency of a conventional amplification circuitry with a fixed matching network.

Figure 15:
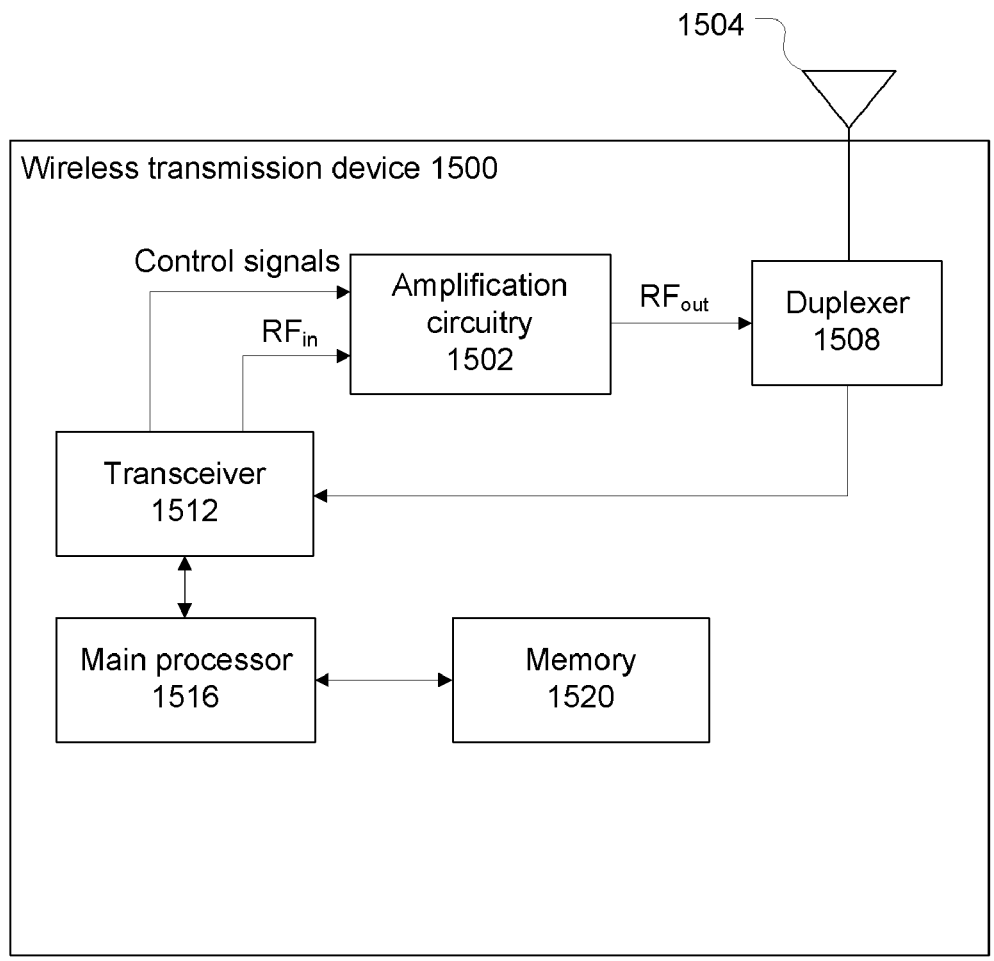
FIG. 15 illustrates a wireless transmission device implementing amplification circuitry in accordance with various embodiments.

A block diagram of an exemplary wireless transmission device 1500 incorporating amplification circuitry 1502, which may be similar to amplification circuitry 100 or 900, is illustrated in FIG. 15 in accordance with some embodiments. In addition to the amplification circuitry 1502, the wireless transmission device 1500 may have an antenna structure 1504, a duplexer 1508, a transceiver 1512, a main processor 1516, and a memory 1520 coupled with each other at least as shown. While the wireless transmission device 1500 is shown with transmitting and receiving capabilities, other embodiments may include wireless transmission devices without receiving capabilities.

In various embodiments, the wireless transmission device 1500 may be, but is not limited to, a mobile telephone, a paging device, a personal digital assistant, a text-messaging device, a portable computer, a desktop computer, a base station, a subscriber station, an access point, a radar, a satellite communication device, or any other device capable of wirelessly transmitting RF signals.

The main processor 1516 may execute a basic operating system program, stored in the memory 1520, in order to control the overall operation of the wireless transmission device 1500. For example, the main processor 1516 may control the reception of signals and the transmission of signals by transceiver 1512. The main processor 1516 may be capable of executing other processes and programs resident in the memory 1520 and may move data into or out of memory 1520, as desired by an executing process.

The transceiver 1512 may receive outgoing data (e.g., voice data, web data, e-mail, signaling data, etc.) from the main processor 1516, may generate the $RF_{in}$ signal to represent the outgoing data, and provide the $RF_{in}$ signal to the amplification circuitry 1502. The transceiver 1512 may also provide one or more control signals, e.g., CTL A and/or CTL B, to the amplification circuitry 1502.

The amplification circuitry 1502 may amplify the $RF_{in}$ signal in accordance with the amplification mode determined by the control signals. The amplified $RF_{out}$ signal may be forwarded to the duplexer 1508 and then to the antenna structure 1504 for an over-the-air (OTA) transmission.

In a similar manner, the transceiver 1512 may receive an incoming OTA signal from the antenna structure 1504 through the duplexer 1508. The transceiver 1512 may process and send the incoming signal to the main processor 1516 for further processing.

In various embodiments, the antenna structure 1504 may include one or more directional and/or omnidirectional antennas, including, e.g., a dipole antenna, a monopole antenna, a patch antenna, a loop antenna, a microstrip antenna or any other type of antenna suitable for OTA transmission/reception of RF signals.

Those skilled in the art will recognize that the wireless transmission device 1500 is given by way of example and that, for simplicity and clarity, only so much of the construction and operation of the wireless transmission device 1500 as is necessary for an understanding of the embodiments is shown and described. Various embodiments contemplate any suitable component or combination of components performing any suitable tasks in association with wireless transmission device 1500, according to particular needs. Moreover, it is understood that the wireless transmission device 1500 should not be construed to limit the types of devices in which embodiments may be implemented.

Figure 16:
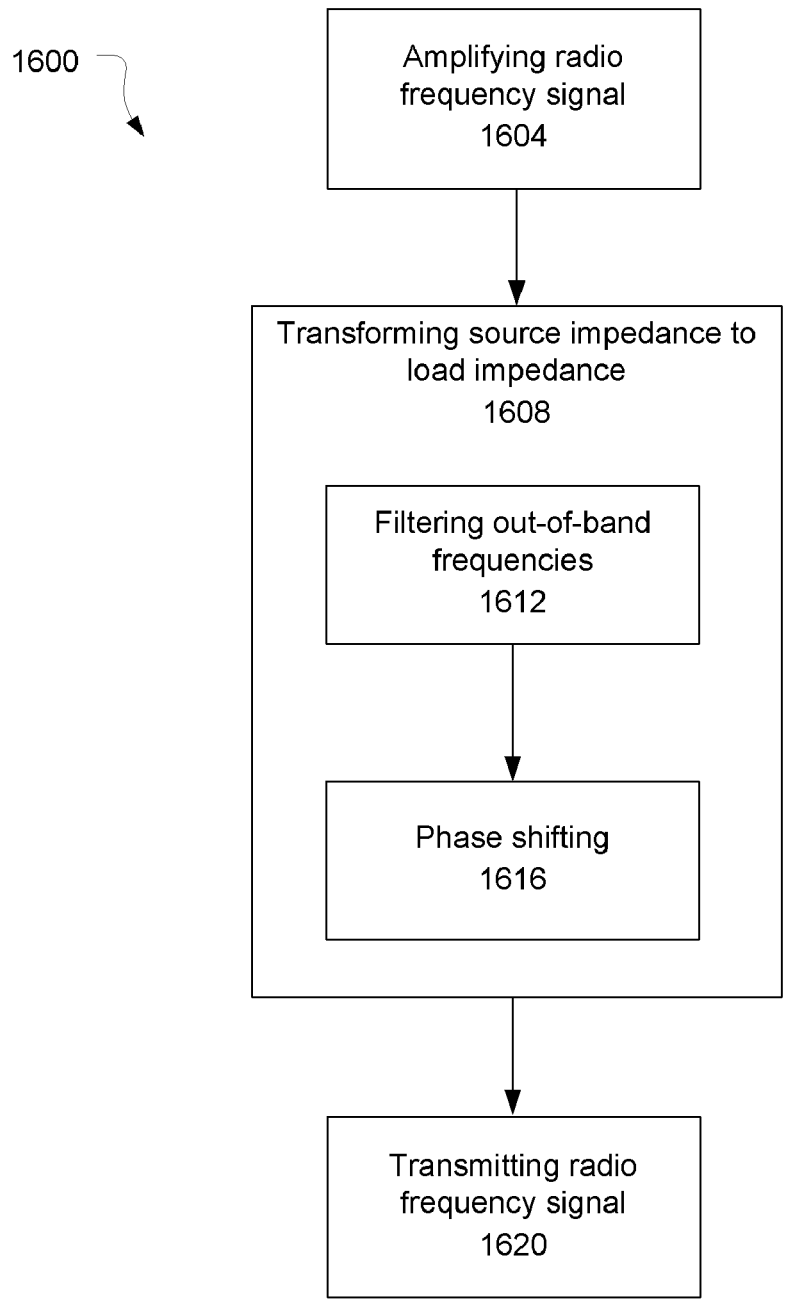
FIG. 16 is a flowchart describing operation of the wireless transmission device in accordance with various embodiments.

FIG. 16 is a flowchart 1600 depicting operation of the amplification circuitry 100 in accordance with some embodiments. At block 1604, the power amplifier 104 may amplify a radio frequency signal. At block 1608, the matching network 108 may transform a source impedance associated with an output of the power amplifier 104 to a load impedance associated with, e.g., an antenna.

In providing the impedance transformation of block 1608, the matching network 108 may filter out-of-band (OOB) frequencies, i.e., frequencies below a first threshold frequency and frequencies above a second threshold frequency, at block 1612, in order to provide a passband response. The matching network 108 may also include at least two Pi networks configured to provide equal, but opposite phase shifts at block 1616, which may result in an in-phase output of the matching network 108.

The radio frequency signal may be transmitted by the antenna 1504 at block 1620.

Although the present disclosure has been described in terms of the above-illustrated embodiments, it will be appreciated by those of ordinary skill in the art that a wide variety of alternate and/or equivalent implementations calculated to achieve the same purposes may be substituted for the specific embodiments shown and described without departing from the scope of the present disclosure. Those with skill in the art will readily appreciate that the teachings of the present disclosure may be implemented in a wide variety of embodiments. This description is intended to be regarded as illustrative instead of restrictive.

What is claimed is:

1. A circuit comprising:
a power amplifier configured to provide single-ended amplification of a radio frequency signal; and
a lattice matching network coupled with the power amplifier and configured to transform a source impedance associated with an output of the power amplifier to a load impedance, wherein
the lattice matching network includes:
a first arm coupled with the power amplifier and an output node, the first arm having a serial high-low network; and
a second arm, coupled with the power amplifier and the output node in parallel with the first arm, the second arm having a serial low-high network,
wherein the serial high-low network and the serial low-high network are configured to provide a passband response with respect to the radio frequency signal.

2. The circuit of claim 1, wherein:
the first arm includes a first capacitor coupled in series with a first inductor, the first arm further including a second inductor having a first terminal and a second terminal, the first terminal coupled with a first node that is between the first capacitor and the first inductor and the second terminal coupled with ground; and
the second arm includes a third inductor coupled in series with a second capacitor, the second arm further including a third capacitor having a third terminal and a fourth terminal, the third terminal coupled with a second node that is between the third inductor and the second capacitor and the fourth terminal coupled with ground.

3. The circuit of claim 2, wherein the lattice matching network further comprises:
a first serial Pi network including the first capacitor, the first inductor, and the second inductor; and
a second serial Pi network including the second capacitor, the third capacitor, and the third inductor.

4. The circuit of claim 2, further comprising:
a harmonic trap including a fourth inductor and a fourth capacitor, the harmonic trap coupled with a third node that is coupled with an output of the power amplifier, the first arm, and the second arm.

5. The circuit of claim 4, wherein the first arm further includes a fifth capacitor coupled in parallel with the first inductor and the second arm further includes a sixth capacitor coupled in parallel with the second capacitor.

6. The circuit of claim 2, wherein:
the serial high-low network consists of the first capacitor, the first inductor and the second inductor; and
the serial low-high network consists of the third inductor, the second capacitor, and the third capacitor.

7. The circuit of claim 1, wherein the lattice matching network is configured to provide an impedance transformation ratio of 1 to 25 or greater, over a fractional bandwidth of 15 percent or greater with an insertion loss of 0.8 dB or less.

8. The circuit of claim 7, wherein the fractional bandwidth includes a passband of approximately 800 megahertz (MHz) to 950 MHz.

9. The circuit of claim 7, wherein the fractional bandwidth includes a passband of approximately 1700 MHz to 2000 MHz.

10. The circuit of claim 1, further comprising:
a tunable matching network coupled with the lattice matching network and configured to provide a variable impedance transformation.

11. The circuit of claim 1, wherein the power amplifier is a first power amplifier and the circuit further comprises:
a high-power path including the first power amplifier and the lattice matching network; and
a low-power path including a second power amplifier, an inductor-capacitor matching network, and one or more switches configured to switch in the low-power path when the circuit is operating in a low-power mode and to switch in the high-power path when the circuit is operating in a high-power mode.

12. The circuit of claim 1, wherein
an input impedance of the first arm is essentially a complex conjugate of an input impedance of the second arm, and an output impedance of the first arm is essentially a complex conjugate of an output impedance of the second arm.

13. A circuit comprising:
a power amplifier to output a radio frequency signal; and
a matching network coupled to the power amplifier and configured to transform a source impedance associated with an output of the power amplifier to a load impedance associated with an antenna, the matching network having:
a first serial Pi network including:
a first Pi network configured to filter out frequencies of the radio frequency signal below a first threshold frequency; and
a second Pi network coupled in series with the first Pi network and configured to filter out frequencies of the radio frequency signal above a second threshold frequency; and a second serial Pi network coupled in parallel with the first serial Pi network and configured to provide a passband response with respect to the radio frequency signal.

14. The circuit of claim 13, wherein the first Pi network is further configured to provide a phase shift of a first amount in a first direction and the second Pi network is further configured to provide a phase shift of the first amount in a second direction that is opposite the first direction.

15. The circuit of claim 14, wherein the first amount is ninety degrees.

16. The circuit of claim 13, wherein the second serial Pi network includes:
a third Pi network configured to filter frequencies below the first threshold frequency; and
a fourth Pi network coupled in series with the third Pi network and configured to filter frequencies above the second threshold frequency.

17. The circuit of claim 16, wherein the third Pi network is further configured to provide a phase shift in the first amount in the first direction, and the fourth Pi network is further configured to provide a phase shift in the first amount in the second direction.

18. A method comprising:
amplifying, with a single-ended power amplifier, a radio frequency signal;
transforming, with a lattice matching network, a source impedance associated with an output of the single-ended power amplifier to a load impedance associate with an antenna;
filtering, with parallel first and second arms of the lattice matching network, out frequencies of the radio frequency signal outside of a predetermined passband; and
transmitting, by the antenna, radio frequency signal,
wherein said filtering further comprises:
filtering, with a first Pi network of the lattice matching network, out frequencies below a first threshold frequency; and
filtering, with a second Pi network of the lattice matching network that is coupled in series with the first Pi network, out frequencies above a second threshold frequency.

19. A method comprising:
amplifying, with a single-ended power amplifier, a radio frequency signal;
transforming, with a lattice matching network, a source impedance associated with an output of the single-ended power amplifier to a load impedance associated with an antenna;
filtering, with parallel first and second arms of the lattice matching network, out frequencies of the radio frequency signal outside of a predetermined passband;
transmitting, by the antenna, the radio frequency signal;
shifting, with a first Pi network of the lattice matching network, a phase of the radio frequency signal by a first amount in a first direction; and
shifting, with a second Pi network of the lattice matching network, the phase of the radio frequency signal, as shifted by the first Pi network, by the first amount in a second direction that is opposite the first direction.

20. A system comprising:
a transceiver configured to provide a radio frequency signal; and
amplification circuitry coupled with the transceiver and including
a power amplifier configured to provide single-ended amplification of the radio frequency signal; and
a lattice matching network coupled to the power amplifier and configured to transform a source impedance associated with an output of the power amplifier to a load impedance associated with an antenna, wherein the lattice matching network includes:
a first arm coupled with the power amplifier and an output node, the first arm having a serial high-low network;
a second arm, coupled with the power amplifier and the output node in parallel with the first arm, the second arm having a serial low-high network,
wherein the serial high-low network and the serial low-high network are configured to provide a passband response with respect to the radio frequency signal.

21. The system of claim 20, wherein:
the first arm includes a first capacitor coupled in series with a first inductor, the first arm further including a second inductor having a first terminal and a second terminal, the first terminal coupled with a first node that is between the first capacitor and the first inductor and the second terminal coupled with ground; and
the second arm includes a third inductor coupled in series with a second capacitor, the second arm further including a third capacitor having a third terminal and a fourth terminal, the third terminal coupled with a second node that is between the third inductor and the second capacitor and the fourth terminal coupled with ground.

22. The system of claim 21, wherein the lattice matching network comprises:
a first serial Pi network including the first capacitor, the first inductor, and the second inductor; and
a second serial Pi network including the second capacitor, the third capacitor, and the third inductor.

23. The system of claim 20, wherein the system comprises a mobile telephone.

* * * * *

UNITED STATES PATENT AND TRADEMARK OFFICE
CERTIFICATE OF CORRECTION

PATENT NO.        : 8,497,744 B1
APPLICATION NO.   : 12/559372
DATED             : July 30, 2013
INVENTOR(S)       : Peter V. Wright Page 1 of 1

It is certified that error appears in the above-identified patent and that said Letters Patent is hereby corrected as shown below:

In the Claims:

Col. 11, line 28 [Claim 18.] "...a load impedance associate with..." should read – "...a load impedance associated with...";

Col. 11, line 33 [Claim 18.] "...antenna, radio..." should read – "...antenna, the radio..."

Signed and Sealed this
Thirtieth Day of June, 2015

Michelle K. Lee
*Director of the United States Patent and Trademark Office*